(12) United States Patent
Lee

(10) Patent No.: US 6,436,611 B1
(45) Date of Patent: Aug. 20, 2002

(54) TRENCH ISOLATION METHOD FOR SEMICONDUCTOR INTEGRATED CIRCUIT

(75) Inventor: Han-sin Lee, Euiwang (KR)

(73) Assignee: Samsung Electronics Co., Ltd., Hwasung (KR)

( * ) Notice: Subject to any disclaimer, the term of this patent is extended or adjusted under 35 U.S.C. 154(b) by 8 days.

(21) Appl. No.: 09/611,799

(22) Filed: Jul. 7, 2000

(30) Foreign Application Priority Data

Jul. 7, 1999 (KR) .............................................. 99-27249

(51) Int. Cl.$^7$ ................................................. G03F 7/00
(52) U.S. Cl. ........................ 430/314; 430/311; 430/313; 430/316; 430/317; 438/424
(58) Field of Search ................................. 430/311, 313, 430/314, 316, 317; 438/424

(56) References Cited

U.S. PATENT DOCUMENTS

| | | | | |
|---|---|---|---|---|
| 4,090,289 A | * | 5/1978 | Dennard et al. ............... | 29/571 |
| 5,372,968 A | * | 12/1994 | Lur et al. ...................... | 437/67 |
| 5,382,541 A | * | 1/1995 | Bajor et al. .................... | 437/67 |
| 5,804,491 A | * | 9/1998 | Ahn ............................. | 438/425 |
| 6,103,594 A | * | 8/2000 | See et al. ..................... | 438/427 |

* cited by examiner

Primary Examiner—Mark F. Huff
Assistant Examiner—Nicole Barreca
(74) Attorney, Agent, or Firm—Marger Jonson & McCollom, P.C.

(57) ABSTRACT

A trench isolation method of a semiconductor integrated circuit is provided. In the trench isolation method, a mask pattern which defines a first opening and a second opening wider than the first opening is formed on a semiconductor substrate. A first spacer for filling the first opening and a second spacer are formed at the sidewalls of the second opening. A sacrificial material layer pattern having an etching rate substantially equal to that of the semiconductor substrate is formed in the second opening surrounded by the second spacer. The semiconductor substrate under the first and second spacers is exposed by selectively removing the first and second spacers. A deep trench region and a shallow trench region are formed in the exposed semiconductor substrate and under the sacrificial material layer, respectively, by etching the exposed semiconductor substrate and the sacrificial material layer pattern. An isolation layer filling the deep trench region and the shallow trench region is formed.

14 Claims, 2 Drawing Sheets

TRENCH ISOLATION METHOD FOR SEMICONDUCTOR INTEGRATED CIRCUIT

BACKGROUND OF THE INVENTION

1. Field of the Invention

The present invention relates to a method of fabricating a semiconductor integrated circuit, and more particularly, to a trench isolation method.

2. Description of the Related Art

Conventionally, LOCal Oxidation of Silicon (LOCOS) isolation technologies were widely used to provide electrical isolation in semiconductor integrated circuits. However, due to some drawbacks of conventional LOCOS isolation technologies, for example, a bird's beak effect, alternative isolation processes were needed for isolating devices in high-density semiconductor integrated circuits. Trench isolation has been one of the various approaches being adopted to deal with the drawbacks of conventional LOCOS isolation technologies.

In trench isolation technologies, a trench region is typically formed by selectively etching a predetermined area of a semiconductor substrate. A dielectric layer for filling the trench region is formed over the entire surface of the resultant structure having the trench region. Next, an isolation trench is formed within the trench region by planarizing the dielectric layer by planarization processes such as chemical mechanical polishing (CMP). Here, if the trench region is narrow, the trench region is completely filled with the dielectric layer. However, if the trench region is wide, the trench region is typically over-etched during the CMP step, thereby causing dishing, i.e., the central portion of the isolation trench becomes thinner. Such dishing effect degrades the planarity of the semiconductor substrate having the isolation layer. In order to overcome the above-described drawback, many solutions have been proposed.

U.S. Pat. No. 5,372,968 discloses a method for improving the planarity of a wide trench region. However, in the method disclosed in U.S. Pat. No. 5,372,968, two steps are needed for forming trenches, that is, shallow trenches and deep trenches. Further, a spin-on-glass (SOG) layer must be etched back and removed. Such a method is complex and is difficult to attain high repeatability.

Accordingly, a need remains for an improved isolation method requiring fewer process steps.

SUMMARY OF THE INVENTION

It is, therefore, an objective of the present invention to provide a trench isolation method that can improve the planarity of a wide trench region by a simple process.

To achieve the above objective, the present invention includes the steps of forming a mask pattern which defines a first opening and a second opening wider than the first opening on a semiconductor substrate, forming a first spacer for filling the first opening and a second spacer at the side walls of the second opening, forming a sacrificial material layer pattern having an etching rate substantially equal to that of the semiconductor substrate in the second opening surrounded by the second spacer, exposing the semiconductor substrate under the first and second spacers by selectively removing the first and second spacers, simultaneously forming a deep trench region in the exposed semiconductor substrate and a shallow trench region in the semiconductor substrate under the sacrificial material layer by simultaneously etching the exposed semiconductor substrate and the sacrificial material layer pattern. Finally, an isolation layer is formed filling the deep trench region and the shallow trench region. The mask pattern is preferably formed by sequentially forming a pad oxide layer and a pad nitride layer on the semiconductor substrate, and patterning the pad nitride layer and the pad oxide layer.

The first and second spacer are preferably formed by forming a spacer material layer over the entire surface of the semiconductor substrate having the mask pattern, and anisotropically etching the spacer material layer until the top surface of the mask pattern is exposed. Here, the spacer material layer is preferably formed of a material layer having an etching selectivity against the mask pattern and the semiconductor substrate, and excellent step coverage. For example, in the case where the semiconductor is a silicon substrate and the mask pattern is formed of a silicon nitride layer, the spacer material layer is preferably formed a CVD silicon oxide layer. Also, the thickness of the spacer material layer must be at least half the width of the first opening. This is because the bottom of the first opening must be entirely covered by the first spacer.

The sacrificial material layer pattern is formed by forming a sacrificial material layer having an etching rate substantially equal to that of the semiconductor substrate, and planarizing the sacrificial material layer until the top surfaces of the mask pattern and the first and second spacers are exposed. Here, when the semiconductor substrate is a silicon substrate, the sacrificial material layer is preferably formed of one of a polysilicon layer, an amorphous silicon layer and a silicon oxynitride layer. Also, the sacrificial material layer is preferably thicker than the mask pattern, and the step of planarizing the sacrificial material is performed by CMP or etch back.

The first and second spacers are preferably removed by a wet etching process.

The shallow trench region and the deep trench region are formed by simultaneously etching the semiconductor substrate and the sacrificial material layer pattern having the substantially the same etch rate as the semiconductor substrate. Thus, the deep trench region is formed in the first opening, and both the deep trench region and the shallow trench region surrounded by the deep trench region are simultaneously formed in the second opening. As a result, a stepped trench region, in which the bottom of the central portion is higher than the bottoms of the edges, is formed in the second opening by a single-step etching process. Here, the sacrificial material layer pattern is completely removed while the trench region is formed. Therefore, an additional process step for removing the sacrificial material layer pattern is not required.

According to the present invention, a stepped trench region in which the bottom of the central portion is higher than the bottoms of the edges can be formed by a single-step etching process, and an additional process step for removing a sacrificial material layer pattern is not required. Therefore, the planarity of an isolation layer formed in a second opening can be improved by a simplified process.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Hereinbelow, a preferred embodiment of the present invention will be described in detail with reference to the accompanying drawings. In the respective drawings, 'a' and 'b' indicate a high-density area and a low-density area, respectively.

Figure 1:
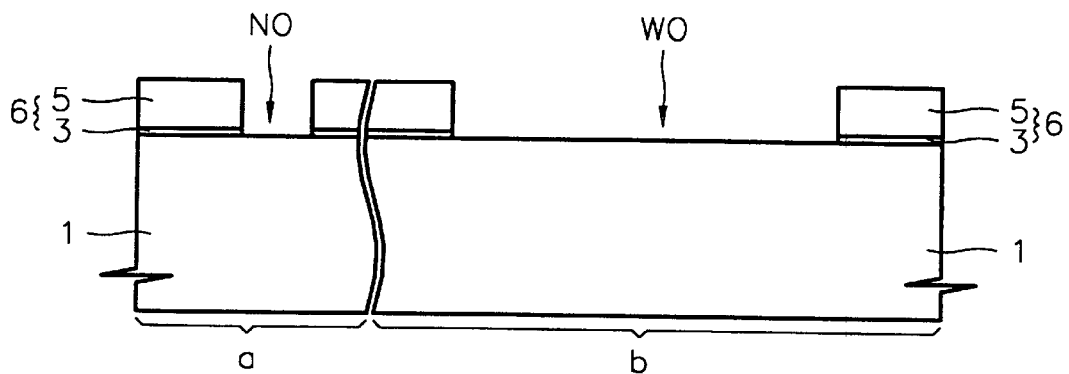
FIGS. 1 through 6 are cross-sectional views illustrating various phases of the trench isolation method according to the present invention.

Referring to FIG. 1, a pad oxide layer and a pad nitride layer are sequentially formed over a semiconductor substrate 1, that is, a silicon substrate. The pad nitride layer and the pad oxide layer are pattern 6 form a mask pattern 6 which defines a first opening (NO) and a second opening (WO) wider than the first opening (NO) in the high-density area (a) and the low-density area (b), respectively. The mask pattern 6 includes a pad oxide pattern 3 and a pad nitride pattern 5, which are sequentially stacked.

Figure 2:
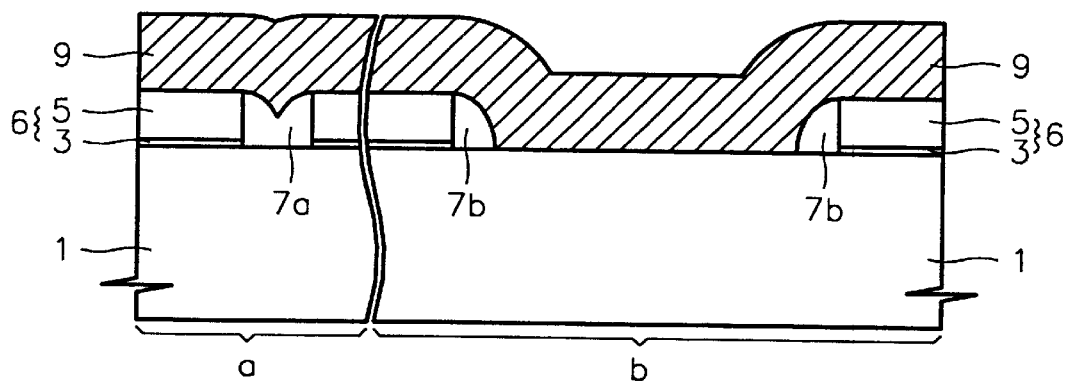

Referring to FIG. 2, a spacer material layer is formed over the entire surface of the resultant structure having the mask pattern 6. The spacer material layer is preferably formed of a material having an etching selectivity against the semiconductor substrate 1 and the mask pattern 6, e.g., a silicon oxide. Also, the spacer material layer is preferably formed of silicon oxide having excellent step coverage, e.g., a CVD oxide. Here, the thickness of the spacer material layer must be at least half the width of the first opening (NO). The spacer material layer is then anisotropically etched to form spacers 7a and 7b at the sidewalls of the mask pattern 6. Here, the first spacer 7a formed in the first opening (NO) substantially entirely covers the bottom of the first opening (NO). However, the second spacer 7b formed in the second opening (WO) covers only the edges of the bottom of the second opening (WO). The central portion of the bottom of the second opening (WO) is exposed. A sacrificial material layer 9 is formed over the entire surface of the resultant structure having the first and second spacers 7a and 7b. The sacrificial material layer 9 is preferably formed of a material having an etch rate substantially equal to that of the semiconductor substrate 1, e.g., polysilicon, amorphous silicon or silicon oxynitride. Also, the sacrificial material layer 9 is preferably formed to be thicker than the mask pattern 6.

Figure 3:
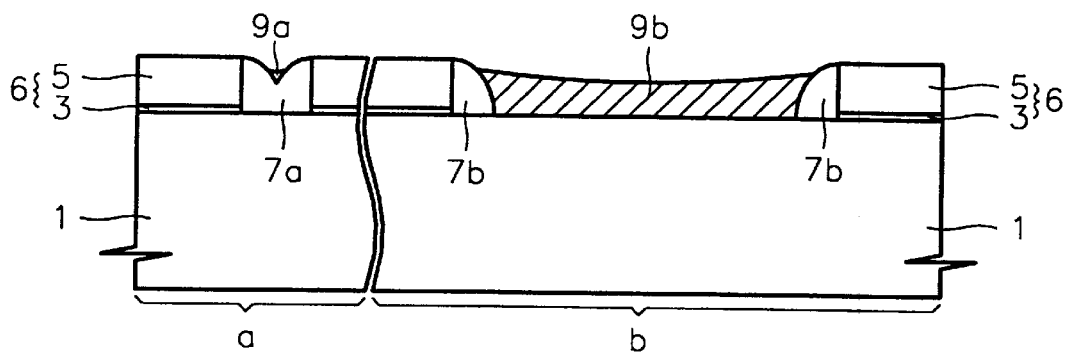

Referring to FIG. 3, the sacrificial material layer 9 is planarized by CMP or etch back until the top surface of the mask pattern 6 and the upper portions of the first and second spacers 7a and 7b are exposed, to leave a sacrificial material layer pattern 9b in the second opening (WO). Here, as shown in FIG. 3, a sacrificial material layer residue 9a may remain on the first spacer 7a formed in the first opening (NO). If the sacrificial material layer 9 is thinner than the mask pattern 6, the central portion of the sacrificial material layer 9 formed in the second opening (WO) may become thinner, which is referred to as dishing. Therefore, in order to form the sacrificial material layer pattern 9b having a uniform thickness, it is preferable that the sacrificial material layer 9 be thicker than the mask pattern 6.

Figure 4:
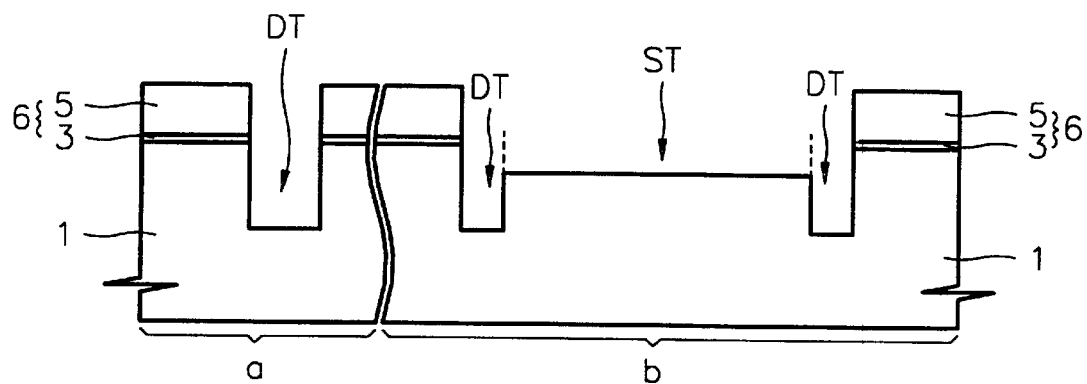

Referring to FIG. 4, the first and second spacers 7a and 7b are selectively removed, thereby exposing the semiconductor substrate 1 thereunder. Selective removal of the first and second spacers 7a and 7b is preferably performed by a wet etching process. This is because the sacrificial material residue 9a remaining in the first opening (NO) can be easily and simply removed by lifting off. The exposed semiconductor substrate 1 and the sacrificial material layer pattern 9b are etched to a predetermined depth by a single step etching process, thereby forming trench regions in the first opening (NO) and the second opening (WO). Here, a deep trench region (DT) is formed in the first opening (NO), that is, the high-density area (a), and both the deep trench region (DT) and the shallow trench region (ST) is formed in the second opening (WO), that is, the low-density area (b). In detail, a stepped trench region in which the bottom of the central portion is higher than the bottom of the edges, is formed in the low-density area (b). If the stepped trench region is formed by simultaneously etching the semiconductor substrate 1 and the sacrificial material layer pattern 9b in the above-described manner, the sacrificial material layer pattern 9b can be completely removed while the trench region is formed. Therefore, an additional process step for removing the sacrificial material layer pattern 9b is not required.

Figure 5:
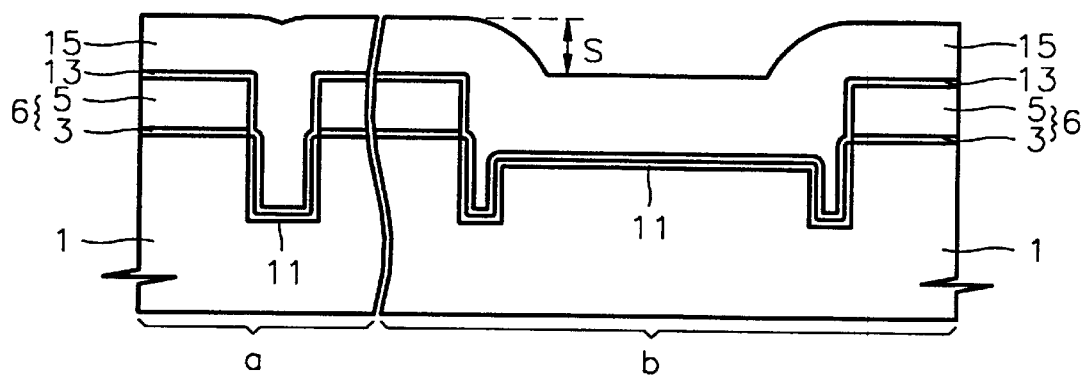

Referring to FIG. 5, the resultant structure where the deep trench region (DT) and the shallow trench region (ST) are formed is thermally oxidized, thereby forming a thermal oxide layer 11 at the sidewalls of and on the bottom of trench regions DT and ST. The thermal oxidation is performed for curing etch damages to the semiconductor substrate 1 during the etching process for forming the trench regions. Subsequently, an oxidation barrier layer 13, e.g., a silicon nitride layer is formed over the entire surface of the resultant structure having the thermal oxide layer 11. The oxidation barrier layer 13 is formed to prevent the sidewalls and bottom of the trench regions from being further oxidized in a subsequent thermal oxidation process. Therefore, the process for forming the oxidation barrier layer 13 may be omitted in the case of fabricating low-density semiconductor integrated circuits. A dielectric layer 15 for filling both the deep trench region (DT) and the shallow trench region (ST), e.g., a CVD oxide layer having excellent step coverage, is formed over the entire surface of the resultant structure having the oxidation barrier layer 13. The step difference S of the thus-formed dielectric layer 15 is noticeably reduced due to the shallow trench region ST formed in the second opening (WO) compared to the case where there exists only a deep trench region without a shallow trench region.

Figure 6:
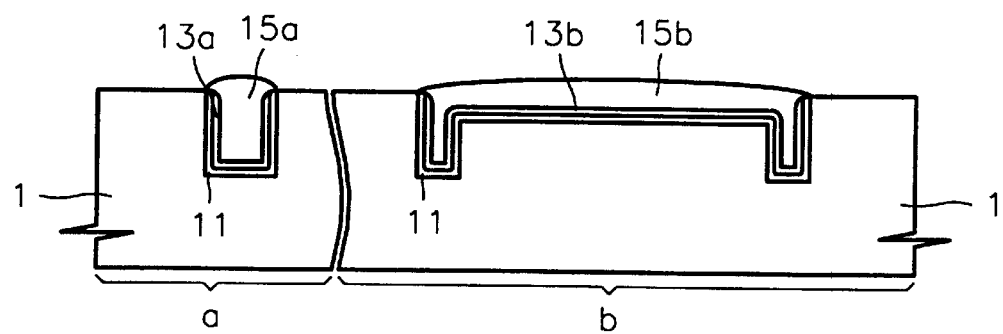

Referring to FIG. 6, the dielectric layer 15 is planarized by CMP until the mask pattern 6 is exposed, thereby forming a dielectric layer pattern and oxidation barrier liners 13a and 13b in the trench region. Here, since the step difference S of the dielectric layer 15 is small in the low-density area (b), the dishing problem caused by CMP can be greatly reduced. Therefore, the dielectric layer pattern having a thickness greater than a predetermined thickness remains on the central portion of the second opening (WO). Subsequently, the mask pattern 6 is removed to expose the active regions between the trench regions. As a result, isolation layers 15a and 15b are formed from the dielectric layer pattern. The thus-formed isolation layers 15a and 15b, in particular, the isolation layer 15b formed in the low-density area (b), exhibit improved planarity, as shown in FIG. 6.

As described above, according to the present invention, a shallow trench region and a deep trench region can be simultaneously formed in a wide opening such as the second opening (WO) by a single-step etching process. Also, a sacrificial material layer pattern for the formation of the shallow trench region is completely removed, without an additional process step during the formation of the trench regions. Therefore, since the process for forming a stepped trench region in a wide opening is simplified, repeatability of a process for improving the planarity of an isolation layer, and productivity can be improved.

While the invention has been particularly shown and described with reference to the preferred embodiment thereof, it will be appreciated that various changes and improvement can be made within the spirit and scope of the invention.

What is claimed is:

1. A trench isolation method comprising the steps of:
    forming a mask pattern which defines a first opening and a second opening wider than the first opening on a semiconductor substrate;

forming a first spacer for filling the first opening and a second spacer at side walls of the second opening;

forming a sacrificial material layer pattern having an etching rate substantially equal to that of the semiconductor substrate in the second opening adjacent the second spacer;

selectively removing the first and second spacers, thereby exposing the semiconductor substrate under the first and second spacers;

simultaneously etching the exposed semiconductor substrate and the sacrificial material layer pattern, thereby simultaneously forming a deep trench region in the exposed semiconductor substrate and a shallow trench region in the semiconductor substrate under the sacrificial material layer pattern; and forming an isolation layer filling the deep trench region and the shallow trench region.

2. The trench isolation method according to claim 1, wherein the semiconductor substrate is a silicon substrate.

3. The trench isolation method according to claim 1, wherein the mask pattern forming step comprises the steps of:

sequentially forming a pad oxide layer and a pad nitride layer on the semiconductor substrate; and sequentially patterning the pad nitride layer and the pad oxide layer.

4. The trench isolation method according to claim 1, wherein the step of forming the first and second spacers, comprises:

forming a spacer material layer having an etching selectivity with respect to the mask pattern and the semiconductor substrate, overlying the mask pattern; and anisotropically etching the spacer material layer until a top surface of the mask pattern is exposed.

5. The trench isolation method according to claim 4, wherein the spacer material layer is a silicon oxide layer.

6. The trench isolation method according to claim 1, wherein the step of forming sacrificial material layer pattern, comprises:

forming a sacrificial material layer having an etching rate substantially equal to that of the semiconductor substrate and being thicker than the mask pattern; and planarizing the sacrificial material layer until a top surface of the mask pattern and the first and second spacers are exposed.

7. The trench isolation method according to claim 6, wherein the sacrificial material layer is one of a polysilicon layer, an amorphous silicon layer and a silicon oxynitride layer.

8. The trench isolation method according to claim 1, wherein said step of selectively removing the first and second spacers comprises a wet etching process.

9. The trench isolation method according to claim 1, further comprising the step of forming a thermal oxide layer at side walls of and on bottom of the shallow trench region and the deep trench region by thermally oxidizing the semiconductor substrate having the shallow trench region and the deep trench region.

10. The trench isolation method according to claim 9, further comprising the step of forming an oxidation barrier layer over the entire surface of the semiconductor substrate having the thermal oxide layer.

11. The trench isolation method according to claim 10, wherein the oxidation barrier layer is a silicon nitride layer.

12. The trench isolation method according to claim 1, wherein said step of forming the isolation layer comprises:

forming a dielectric layer over the entire surface of the semiconductor substrate, the dielectric layer filling the shallow trench region and the deep trench region;

planarizing the dielectric layer until the mask pattern is exposed, thereby forming a dielectric layer pattern in the deep trench region and the shallow trench region; and removing the mask pattern.

13. The trench isolation method according to claim 12, wherein said planarizing comprises CMP.

14. The trench isolation method according to claim 1, wherein the sacrificial material layer pattern is completely removed.

* * * * *